(12) United States Patent
David et al.

(10) Patent No.: US 9,281,798 B2
(45) Date of Patent: Mar. 8, 2016

(54) DEVICE FOR IMPEDANCE MATCHING A COMPONENT, COMPRISING A FILTER HAVING MATCHABLE IMPEDANCE, BASED ON A PEROVSKITE TYPE MATERIAL

(75) Inventors: Jean-Baptiste David, Grenoble (FR); Christophe Billard, Renage (FR); Emmanuel Defay, Voreppe (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 533 days.

(21) Appl. No.: 13/173,219

(22) Filed: Jun. 30, 2011

(65) Prior Publication Data

US 2012/0007666 A1 Jan. 12, 2012

(30) Foreign Application Priority Data

Jul. 6, 2010 (FR) ...................................... 10 55450

(51) Int. Cl.
  *H04B 1/10* (2006.01)
  *H03H 7/40* (2006.01)
  *H03H 9/02* (2006.01)

(52) U.S. Cl.
  CPC ............. *H03H 9/02031* (2013.01); *H03H 7/40* (2013.01)

(58) Field of Classification Search
  CPC .................................................. H03H 9/02031
  USPC .......................................... 333/189, 32, 17.1
  See application file for complete search history.

(56) References Cited

U.S. PATENT DOCUMENTS

| 6,388,544 | B1* | 5/2002 | Ella ................................ 333/189 |
| 6,870,446 | B2* | 3/2005 | Ohara et al. ................... 333/188 |
| 2001/0028285 | A1 | 10/2001 | Klee et al. | |
| 2007/0210879 | A1* | 9/2007 | Cardona et al. ............... 333/188 |
| 2008/0012659 | A1* | 1/2008 | Frank .............................. 333/32 |

(Continued)

FOREIGN PATENT DOCUMENTS

| EP | 2037576 A2 | 3/2009 |
| JP | 2001-177365 A | 6/2001 |
| JP | 2009-529833 A | 8/2009 |

OTHER PUBLICATIONS

Pavel A Turalchuk, "Modelling of tunable bulk acoustic resonators and filters with induced piezoelectric effect in BSTO film in a wide temperature range," EUROCON 2009, EUROCON '09, IEEE, IEEE, Piscataway, NJ, USA, May 18, 2009, pp. 64-69.

(Continued)

*Primary Examiner* — Stephen E Jones
*Assistant Examiner* — Scott S Outten
(74) *Attorney, Agent, or Firm* — Baker & Hostetler LLP (57) ABSTRACT

A device comprises at the input a first component (PA) having a first output impedance ($Z_1$), at the output a second component (ANT) having a second input impedance ($Z_2$), and an impedance-matching network between said first and second components. Because the first and/or the second impedance vary/varies, said impedance-matching network comprises a filter ($F_{adp}$), with an impedance that is matchable to the first and second impedances, located between said first and second components and comprising at least two acoustic wave coupled resonators. At least one of the resonators comprises a perovskite type material and means for applying a voltage to said resonator, which enable the permittivity and the impedance thereof to be varied.

12 Claims, 9 Drawing Sheets

(56) References Cited

U.S. PATENT DOCUMENTS

2011/0061215 A1 3/2011 Defay et al.
2011/0080069 A1 4/2011 Cueff et al.

OTHER PUBLICATIONS

Noeth A et al.: "Tunable think film bulk acoustic wave resonator based on BaxSr1xTiO3 thin film," IEEE Transactions on Ultrasonics, Ferroelectrics and Frequency Control, IEEE, US, vol. 57, No. 2, Feb. 1, 2010, pp. 379-385.

Ivira B et al.: "Integration of electrostrictive Ba0.7Sr0.3TiO3 thin films into Bulk Acoustic Wave resonator for RF-frequency tuning under DC bias," Frequency Control Symposium, 2008 IEEE International, IEEE, Piscataway, NJ, USA, May 19, 2008, pp. 254-258.

E. L. Firrao, A. J. Annema and B. Nauta: "An Automatic Antenna Tuning System using only RF-Signal Amplitudes," IEEE TCAS-II, 2008, pp. 1-5.

Wai Chan et al.: "A fast and accurate automatic matching network designed for ultra low power medical applications," Circuits and Systems, 2009, IEEE ISCAS 2009, pp. 673-676.

Chan Wai Po, F. et al.: "A 2.4 GHz CMOS automatic matching network design for pacemaker applications," Circuits and Systems and TAISA Conference, 2009.

Foster, F. S. et al.: "Characterization of lead zirconate titanate ceramics for use in miniature high-frequency (20-80 MHz) transducers," IEEE Transactions on Ultrasonics, Ferroelectrics and Frequency Control, vol. 38, Issue 5, Sep. 1991, pp. 446-453.

Lobl, H. P. et al.: "Piezo-electric AlN and PZT films for microelectronic applications," IEEE Ultrasonics Symposium, 1999, pp. 1031-1036.

Refusing Reason Notice issued in JP Patent Application No. 2011-145315 issued Jun. 9, 2015.

* cited by examiner

DEVICE FOR IMPEDANCE MATCHING A COMPONENT, COMPRISING A FILTER HAVING MATCHABLE IMPEDANCE, BASED ON A PEROVSKITE TYPE MATERIAL

CROSS-REFERENCE TO RELATED APPLICATIONS

This application claims priority to foreign French patent application FR 10 55450, filed on Jul. 6, 2010, the disclosure of which is incorporated herein by reference in its entirety.

FIELD OF THE INVENTION

The field of the invention is that of impedance-matching devices particularly of interest for component, and notably antenna, impedance followers in the transmitters or receivers of radio-frequency networks confronted with varying impedances.

BACKGROUND OF THE INVENTION

At the present time, agility requirements are increasingly exacting, notably because of the increased use of the electromagnetic spectrum, the systematic increase in required bandwidths and the software reconfigurability of mobile terminals.

Figure 1:
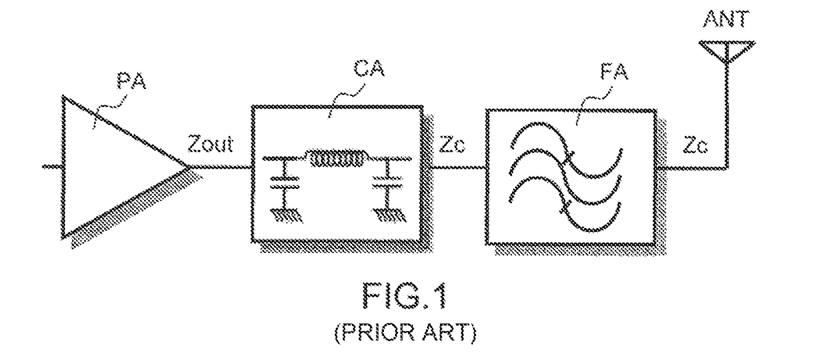
FIG. 1 illustrates an RF transmitter comprising a known prior-art filter.

An RF transmitter, as illustrated in FIG. 1, generally comprises three main units between, for example, the generation of a high-power radio signal and the antenna.

These three units are the power amplifier PA having an output impedance Zout; the matching network CA, at the output of the amplifier, which ensures the transfer of energy from the amplifier to the antenna; and the antenna filter FA, which ensures the spectral purity of the signal delivered by the system to the antenna ANT.

Since the amplifiers, filters and antennas are often made by different suppliers, the components must therefore operate at a given characteristic impedance Zc.

Figure 2:
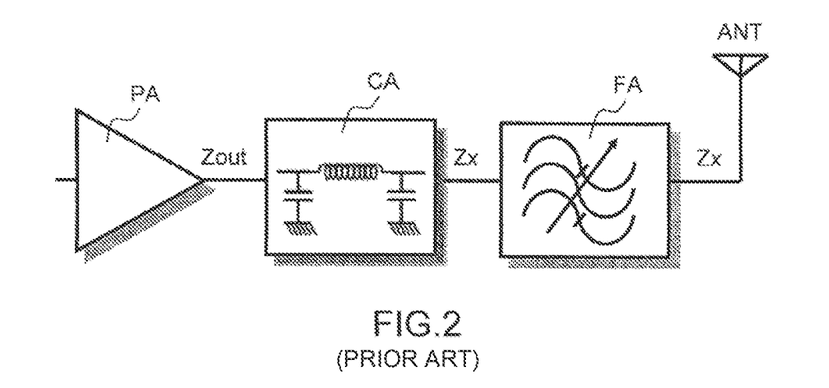
FIG. 2 illustrates an RF transmitter comprising a filter having an impedance matchable to that of the antenna, according to the prior art.

With advanced miniaturization of mobile telephones, antenna manufacturers would like to be freed from the constraint of a standard impedance for reasons of optimization. As a result, system designers must either add a matching network at the output of the filter or provide filters having an impedance Zx which matches the specific impedance of the antenna, they thus tend to implement arrangements such as that illustrated in FIG. 2.

Compensating for these dynamic behaviours not only ensures, in the short-term, a reduction in the power consumed by current systems but also enables use of certain systems that are innovative because of their reconfigurability.

Several prior-art approaches are described in the literature and notably in the following article: "*An Automatic Antenna Tuning System using only RF-Signal Amplitudes*", E. L. Firrao, A. J. Annema and B. Nauta, IEEE TCAS-II, 2008.

The authors, from the University of Twente and from Thales, propose dynamic antenna matching combined with the concept of matching by separately adjusting the real part and the imaginary part of the impedance.

After the system has sensed the mismatch between the antenna and the RF units, dynamically adjustable elements make it possible to change the impedance locus of the antenna. The impedance is matched after a convergence time. The principle was demonstrated for a 900 MHz signal, and for discrete impedances. However, effectiveness over a wide frequency band, and for far-reaching impedance loci, is as yet unproven.

Other authors, including a team at the CEA, have developed a substantially different approach in collaboration with the University of Bordeaux and the Sorin Group (which has notably specialised in the development of pacemakers), which approach is described in the article: "*A fast and accurate automatic matching network designed for ultra low power medical applications*", Wai Chan; De Foucauld, E.; Vincent, P.; Hameau, F.; Morche, D.; Delaveaud, C.; Dal Molin, R.; Pons, P.; Pierquin, R.; Kerherve, E.; Circuits and Systems, 2009, IEEE ISCAS 2009.

A matching network comprising several variable elements is controlled by a microcontroller or processor, the role of which is to specify control set points depending on analysis of a signal sampled via an attenuator.

Figure 3:
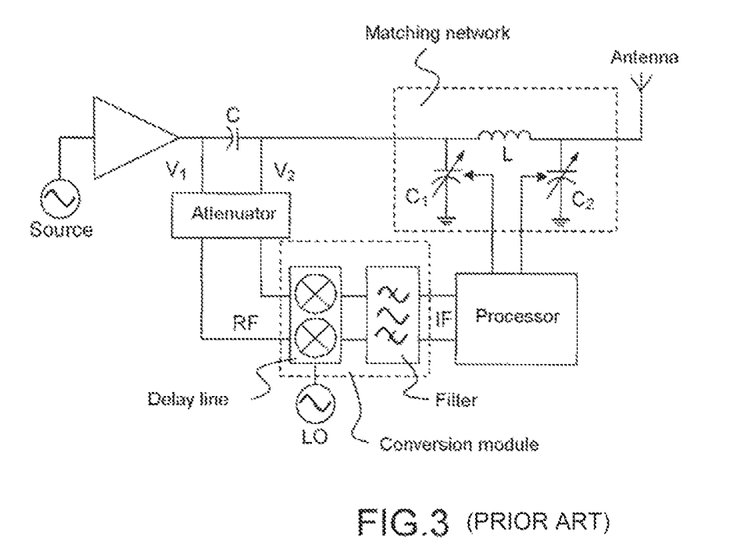
FIG. 3 illustrates an automatic antenna impedance matching solution according to the prior art.

This approach was demonstrated around the 402-405 MHz ISM band and assumes a processing time of almost 1 ms. FIG. 3 illustrates automatic antenna impedance matching at 400 MHz using a microcontroller.

Comparable results have been published, by the same team, for the 2.4 GHz ISM band, in the following article: "A 2.4 GHz CMOS automatic matching network design for pacemaker applications"; Chan Wai Po, F.; De Foucauld, E.; Vincent, P.; Hameau, F.; Kerherve, E.; Molin, R. D.; Pons, P.; Pierquin, R.; Circuits and Systems and TAISA Conference, 2009.

Although the theoretical principle of direct matching using a microcontroller has been demonstrated, and was subject matter for a patent filed by the CEA (EP 2 037 576), its use remains complicated and limited by the physical implementation. Thus, impedance coverage depends on the complexity of the matching network and notably on the number of adjustable elements and their nature (inductors or capacitors). Moreover, this approach, which has the benefit of being direct (and non-iterative) and is therefore likely to be fast, requires that it be possible to calculate analytically the value of the adjustable elements. The analytical calculation is easily implemented within the microcontroller; however, the complexity of the implementation increases with the number of variable elements and with the presence of filtering elements between the amplifier and the antenna.

The effectiveness of this approach depends on the number of tunable elements available, on their range of variation, on their quality and on the extent to which the impedance of the antenna varies.

Figure 4:
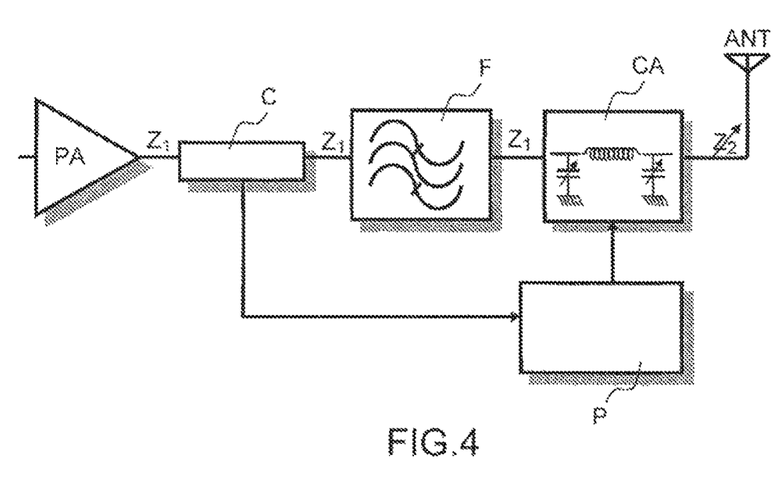
FIG. 4 illustrates how the dynamic impedance matching is arranged with transmission filter.

Thus, if a post-amplification filter is required, the arrangement illustrated in FIG. 4 may be employed. A sensor C is placed at the output of the amplifier and has an input impedance and an output impedance Z1. The series of units furthermore comprises the filter F and a matching network CA allowing conversion from the impedance $Z_1$ to an impedance $Z_2$, a processor P being provided to control the matching network and to adjust the latter depending on variations in the impedance of the antenna ANT.

Matching takes place after the filter, which must then have a characteristic impedance identical to the output impedance of the power amplifier. It is recalled that filters are reciprocal elements, i.e. they have the same input and output impedance.

SUMMARY OF THE INVENTION

With the aim of relaxing the constraints on the adjustable matching network and increasing the field of application of the method described here, the applicant has developed a device for matching component impedance that is particularly simple and fast making impedance-agile filters having extremely low matching times possible, these filters employing materials the dielectric permittivity of which may be rapidly varied.

More precisely the subject of the present invention is a device comprising at the input a first component having a first output impedance, at the output a second component having a second input impedance, and an impedance-matching network between said first and second components, characterized in that, since the first and/or the second impedance vary/varies, said impedance-matching network comprises a filter, with an impedance that is matchable to the first and second impedances, located between said first and second components and comprising at least two acoustic wave coupled resonators, at least one of the resonators comprising a perovskite type material and means for applying a voltage to said resonator so as to vary the permittivity and the impedance thereof.

According to one variant of the invention, each resonator comprises a perovskite type material.

According to another variant of the invention, the filter comprises bulk wave resonators.

According to another variant of the invention, the filter comprises FBAR bulk wave resonators comprising a multilayer comprising at least one supporting membrane and a layer of perovskite type material.

According to one variant of the invention, the filter comprises SMR bulk wave resonators comprising at least one acoustic reflector and a layer of perovskite type material.

According to another variant of the invention, the perovskite type material is based on barium strontium titanate (BST).

According to another variant of the invention, the filter comprises a set of resonators connected in a ladder and/or trellis structure.

According to another variant of the invention, said impedance-matching network furthermore comprises other impedance elements.

According to another variant of the invention, the variable impedance component is an antenna and may be the first or the second component.

According to another variant of the invention, the variable impedance component is an amplifier and may be the first and/or the second component(s).

According to another variant of the invention, the variable impedance component is a transistor and may be the first and/or second component(s).

According to another variant of the invention, the device is included in a radio-frequency transmitter and/or receiver in which the first component is an amplifier, the second component being an antenna.

According to another variant of the invention, the means for applying a voltage are set to a voltage range in which the frequency passband of said impedance-matching filter changes little, typically by a few percent.

The impedance-matching network may furthermore comprise, in addition to the filter, complementary elements, (generally in series) such as inductors and/or capacitors, which increase the possible range of impedance variation of the device.

BRIEF LIST OF THE DRAWINGS

The invention will be better understood and other advantages will become clear on reading the following non-limiting description and by virtue of the appended figures in which.

DETAILED DESCRIPTION OF THE INVENTION

According to the present invention, it is proposed to produce an impedance-matching filter using resonators comprising a perovskite type material, and such that its dielectric constant varies greatly under the action of a variation in applied electric field. This is because this type of material has high dielectric constants that are likely to vary greatly under the action of an electric field.

The invention will be described below for bulk wave resonators, but it may nevertheless also be used in surface wave or Lamb wave filters, said filters comprising a perovskite type material having properties such that the impedance of each resonator may be modified using a DC voltage applied to its terminals.

Figure 5:
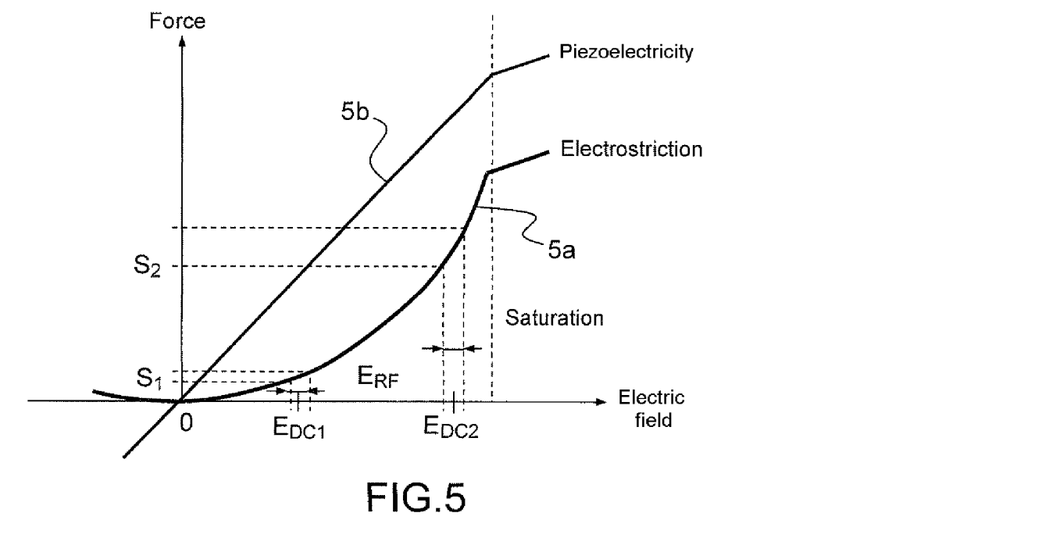
FIG. 5 illustrates the variation of the deformation under the effect of an electric field in a conventional piezoelectric material and in an electrostrictive material.

The advantage of perovskite type materials and notably $(Pb(Mg_{1/3}Nb_{2/3})O_3)(PMN)$ is illustrated in FIG. 5.

These materials generally have a crystalline arrangement such that they exhibit very pronounced electrostrictive properties, which notably result in a piezoelectric coupling coefficient that depends on applied DC voltage. Thus the slope $S_1$ of the perovskite material varies depending on the value of the electric field $E_{DC1}$, as illustrated by curve 5a in FIG. 5, in contrast to a conventional piezoelectric material having a slope $S_2$, the coupling coefficient of which remains constant whatever the applied electric field $EDC_2$, as illustrated by curve 5b.

Specifically, the advantage of perovskite type materials lies in the non-linearity of the variation of the deformation under the effect of an electric field in comparison to conventional piezoelectric materials, making it possible, with such materials, to obtain a high sensitivity in terms of variation in electrical permittivity, $\in$, and therefore impedance as a function of applied electric field.

The variation of the physical properties of materials under the effect of an electric field $E_{dc}$ (known as electrostriction), notably permittivity $\in$, stiffness c, and the piezoelectric coupling factor h, is described by the following equations:

$$\varepsilon^S = \frac{1}{\beta^S} = \frac{\varepsilon_r(0) \cdot \varepsilon_0}{2\cosh\left(\frac{2}{3}\sinh^{-1}\left(2\frac{E_{dc}}{E_{1/2}}\right)\right)}$$

$$c^D = c_0^D + M\varepsilon^{S^2} E_{dc}^2$$

$$-h = 2G\varepsilon^S E_{dc}\left(1 - \frac{M\varepsilon^{S^2} E_{dc}^2}{c_0^D}\right)$$

$$c_{33}^D = c_{33}^E + \frac{e^2}{\varepsilon^S}$$

$$h = \frac{e}{\varepsilon^S}.$$

All the physical properties of conventional piezoelectric materials are recognizable in these equations, but additional effects are also present represented by the electrostrictive coefficients M and G and the electrical damping coefficient $E_{1/2}$.

Such materials for acoustic transducers have notably been described in articles by Foster, F. S.; Ryan, L. K.; Turnbul, D. H.; "*Characterization of lead zirconate titanate ceramics for use in miniature high-frequency (20-80 MHz) transducers*"; Ultrasonics, Ferroelectrics and Frequency Control, Volume 38, Issue 5, September 1991.

The first publication mentioning the use of such materials in microelectronics date from 1999, and notably from: Lobl, H. P.; Klee, M.; Wunnicke, O.; Kiewitt, R.; Dekker, R.; Pelt, E. V.; "*Piezo-electric AlN and PZT films for micro-electronic applications*"; Ultrasonics Symposium, 1999. PZT (lead zirconate titanate) is of interest because of the piezoelectric properties it exhibits in radiofrequency applications.

PZT and most perovskite materials have a high dielectric permittivity, meaning their obvious use is not in applications employing their piezoelectric properties, such as filters or resonators, but in means for integrating very-high-density capacitors.

At the present time, alternative compounds have been proposed in the last few years such as for example barium strontium titanate (BST) as notably described in the publication: Ivira, B.; Reinhardt, A.; Defay, E.; Aid, M.; "*Integration of electrostrictive $Ba_{0.7}Sr_{0.3}TiO_3$ thin films into Bulk Acoustic Wave resonator for RF-frequency tuning under DC bias*"; Frequency Control Symposium, 19-21 May 2008.

Figure 6:
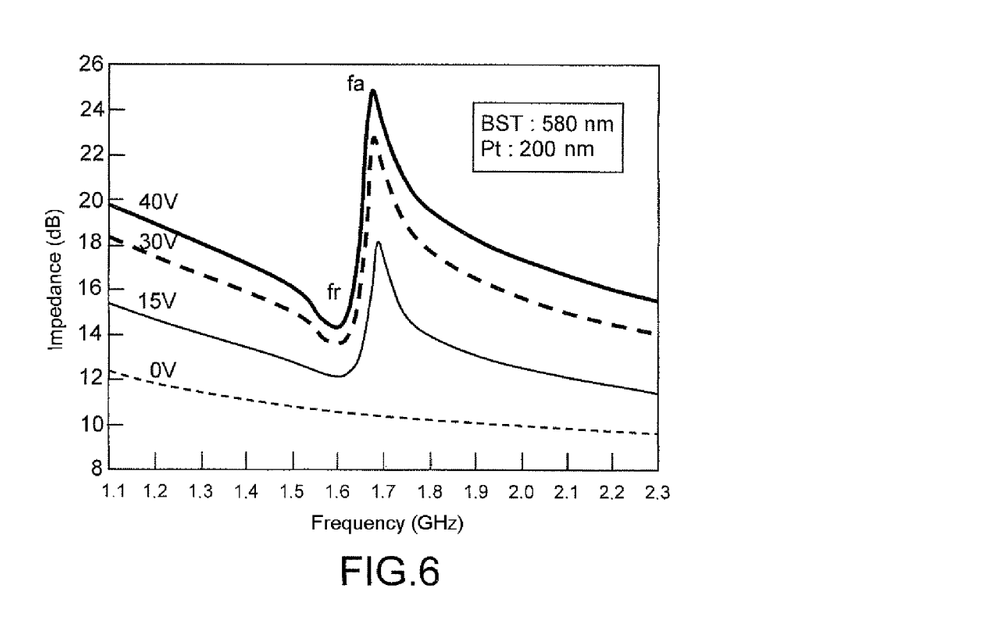
FIG. 6 illustrates the impedance variation as a function of frequency at various voltages applied to a BST layer 580 nm in thickness in the presence of 200 nm platinum electrodes.

FIG. 6, taken from this publication, shows in this respect the extent of impedance variation as a function of voltage applied to a layer of BST 580 nm in thickness in the presence of 200 nm platinum electrodes. Nevertheless this publication focused specifically on the analysis of the BST layer produced, and did not relate to resonators. In FIG. 6 $f_r$ is a resonant frequency and $f_a$ is an anti-resonance frequency, as understood by one of ordinary skill in the art.

Filters based on a variable-frequency BST material have also been described in the literature, but they have not been used to provide an impedance adjustment function in an impedance-matching network in a series of units comprising at least two components, the impedances of which are likely to vary. Mention may notably be made in this respect of the following references: Pavel A Turalchuk et al.; "*Modelling of tunable bulk acoustic resonators and filters with induced piezoelectric effect in BSTO film in a wide temperature range*"; Noeth A. et al.; "*Tunable thin film bulk acoustic wave resonator based on $Ba_xSr_{1-x}TiO_3$*"; and the patent US 2001/02825.

In this context, the applicant has chosen to use a model for which the robustness has been previously demonstrated, in the production of aluminium nitride based filters, so as to prove the benefit of this type of material in the problem addressed by the present invention. The model used was the electroacoustic Mason's model. Here the model was changed to reflect the particularities of the BST material, notably to introduce the electric-field dependence.

The physical constants used were obtained from analysis of devices produced by the applicant.

Figure 7:
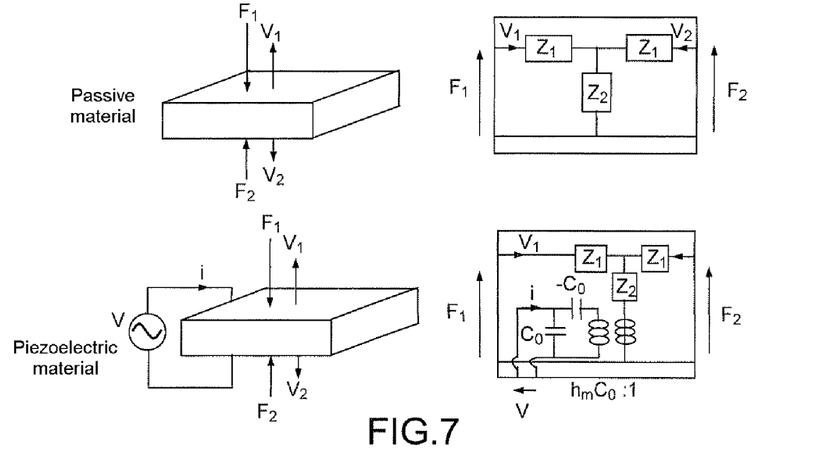
FIG. 7 illustrates the electromechanical equivalent circuits of a passive material and of a piezoelectric material.
Figure 8:
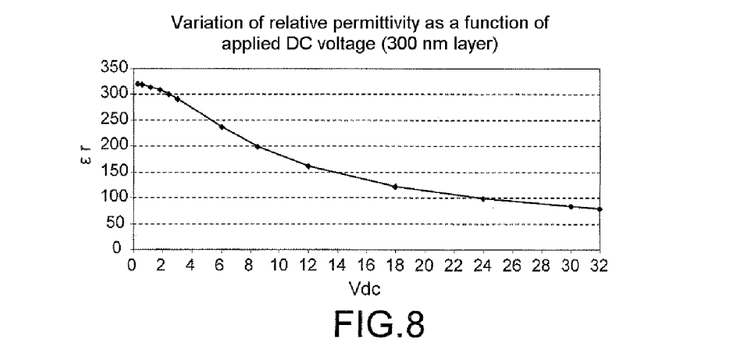
FIG. 8 illustrates the variation of permittivity as a function of applied DC voltage for a BST-based bulk wave resonator, according to a Mason's model.
Figure 9:
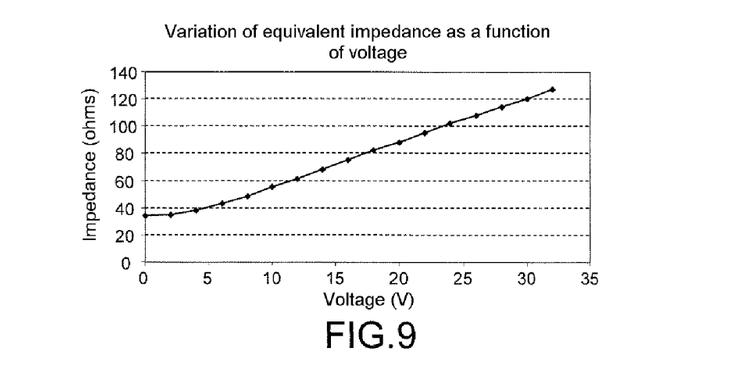
FIG. 9 illustrates the variation of the equivalent impedance as a function of the applied DC voltage for a BST-based bulk wave resonator.
Figure 10:
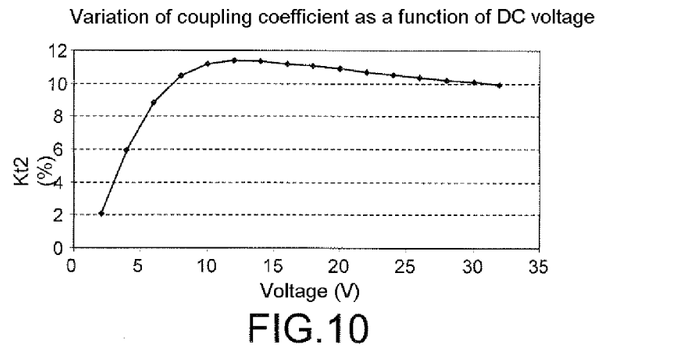
FIG. 10 illustrates the variation of the coupling coefficient as a function of applied DC voltage for a BST-based bulk wave resonator.
Figure 11:
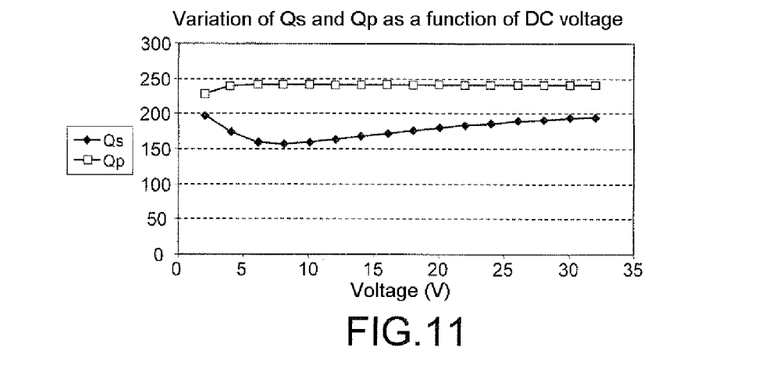
FIG. 11 illustrates the variation of the Q factors Qs and Qp, respectively at what are called the series and parallel resonant frequencies, as a function of applied DC voltage for a BST-based bulk wave resonator.
Figure 12:
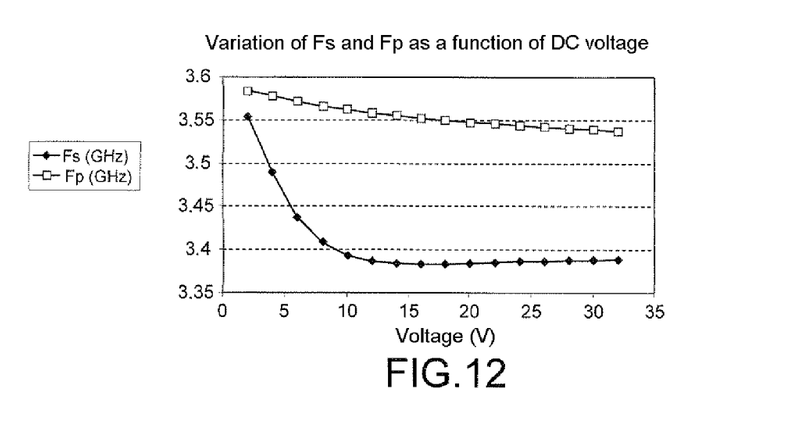
FIG. 12 illustrates the variation of the series and parallel resonant frequencies as a function of applied DC voltage for a BST-based bulk wave resonator.

More precisely, Mason's model is an electromechanical model and it allows the effects of loading and the mechanical interactions of materials, in the case of bulk wave resonators, to be expressed as a function of the rates of displacement of either end of the piezoelectric layer. By electromechanical analogy, the forces $F_1$ and $F_2$ are represented by voltages $V_1$ and $V_2$ and the rates of displacement are represented by currents. Thus, the piezoelectric layer is modelled as a network having two voltage ports and one current port due to its piezoelectric properties, and therefore its capacity to generate electroacoustic energy in the presence of a force $F_1$ or $F_2$ at its interfaces, whereas other passive materials, essentially the electrodes, are modelled as networks having only voltage ports, as illustrated in FIG. 7.

More precisely, the applicant has demonstrated the following features using a BAW resonator produced using a BST material, the properties of the resonator being obtained using the following multilayer:
a layer of piezoelectric material: 300 nm of BST;
electrodes: 100 nm of Pt;
means for applying a voltage of between 0 and 32 V; and
having an area of: 12 μm×12 μm (50Ω at 8.5 V).
The performance obtained at 8.5 V was:
a series frequency Fs=3.404 GHz;
a series Q factor Qs=157;
a parallel frequency Fp=3.565 GHz;
a parallel Q factor Qp=242; and
a coupling coefficient $K_r^2$=10.65%.

From all of FIGS. 8, 9, 10, 11 and 12 together it is possible to make the following observations, demonstrating the properties of such a resonator. The variation of the impedance of the resonator, related to that of the permittivity, is noted. It is observed that the coupling coefficient varies very rapidly at low field strengths and then varies only slowly. The large variation in the series resonance relative to the parallel resonance is also seen. It is also noted that at high field strengths the two resonances trend in opposite directions. Notably, it was this analysis, presented with the new need for filter functionality in automatic matching networks, which resulted in the inventive features described in the present invention.

Exemplary Impedance-Matching Filter According to the Invention:

The impedance-matching filter comprised a double lattice structure and resonators based on a BST perovskite type material.

Figure 13A:
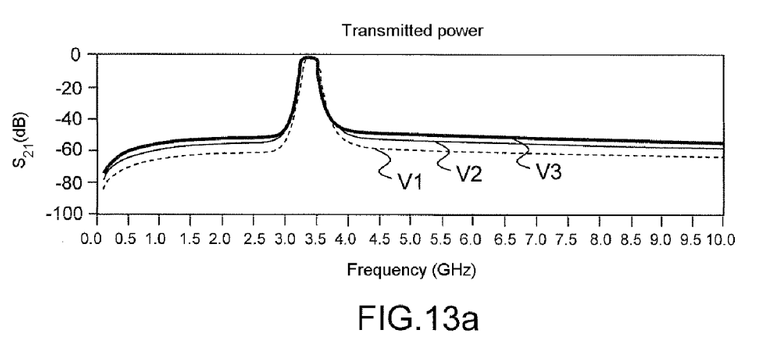
FIGS. 13a, 13b and 13c illustrate the variation in the power transmitted and the losses in a BST-based filter used in the present invention and for a first range of applied voltages.
Figure 13B:
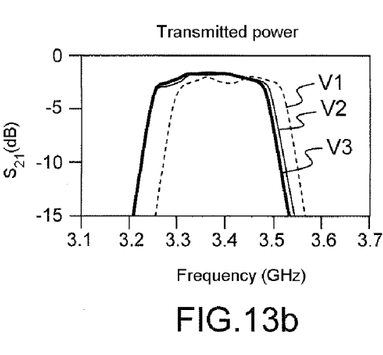
Figure 13C:
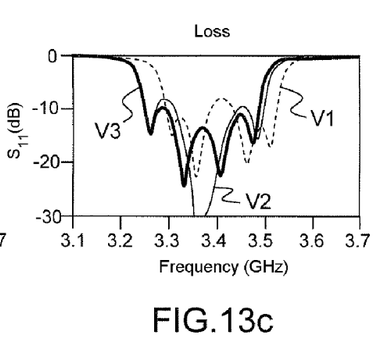

FIGS. 13a, 13b and 13c show the response of such a double lattice filter, the DC voltage of which, applied simultaneously to the resonators of the filter, took the values V1, V2 and V3. The consequent equivalent characteristic impedance of the filter is given in the following table:

| Vdc (V)      | V1 = 6 V | V2 = 19 V | V3 = 32 V |
| ------------ | -------- | --------- | --------- |
| Zeq diff (Ω) | 100      | 200       | 300       |

It was observed that the central frequency of the filter varied little from V1 to V3, and more noticeably between V1 and V2 than between V2 and V3. This was due to the fact that the coupling coefficient and the resonant frequencies of the resonators varied more at lower voltages than at higher voltages, as was the case for the curves shown in FIGS. 8 to 12. Moreover, the impedance itself was observed to vary linearly in the same range of voltage variation.

In the present example, the real part of the characteristic impedance of the filter varied by a factor of 3 (from 100 to 300 ohms) between V1 and V3. The filter had a maximum power transmission in a band lying between 3.3 GHz and 3.485 GHz, i.e. 185 MHz wide (which may also be expressed as a percentage of the central frequency i.e. 5.5% at 3.4 GHz). This compared to 230 MHz (i.e. 6.7% at 3.4 GHz) obtained for V=V3, it was potentially possible to lose 20% of the passband. The reflection coefficient itself remained satisfactory, about −10 dB in the range used.

It was of interest to reduce the range of impedance followed so as to increase the useable passband, making it possible to avoid the large variations at low voltage.

| Vdc (V)      | V1' = 13 V | V2 = 19 V | V3 = 32 V |
| ------------ | ---------- | --------- | --------- |
| Zeq diff (Ω) | 150        | 200       | 300       |

Figure 14A:
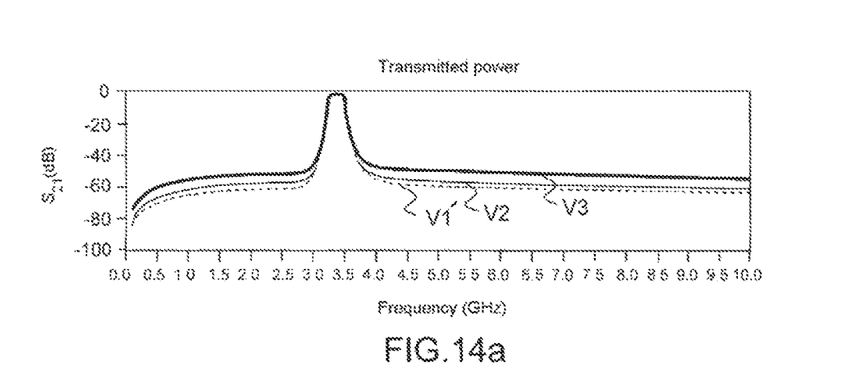
FIGS. 14a, 14b and 14c illustrate the variation in the power transmitted and the losses in a BST-based filter used in the present invention and for a second range of applied voltages.
Figure 14B:
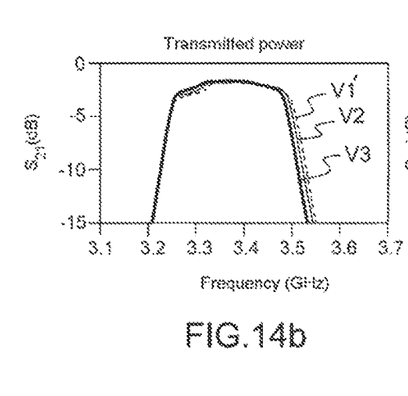
Figure 14C:
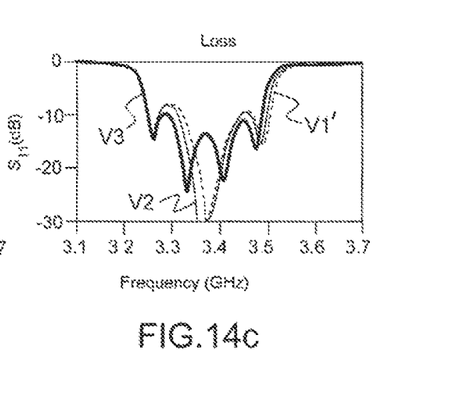

Thus by restricting the impedance followed to between 150 and 300 ohms in this example (voltage lying between 13 V and 32 V), the passband varied by only 5%. This is illustrated in FIGS. 14a, 14b and 14c for voltages V1', V2 and V3 of 13, 19 and 32 V.

Figure 15:
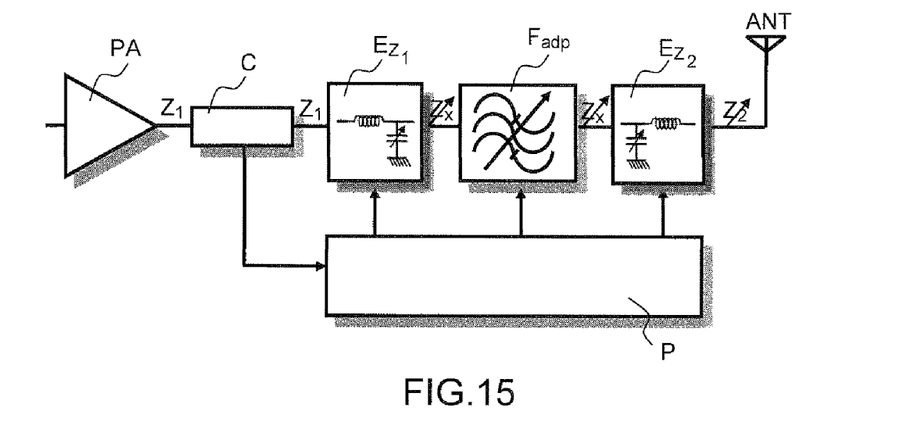
FIG. 15 illustrates an arrangement of an impedance-matching device according to the invention.

According to the present invention, it is thus proposed to produce an impedance-matching device using an impedance-matching filter and to include it in a transmitter such as that illustrated in FIG. 15. More precisely, this dynamically operating amplification chain comprises: a power amplifier PA; a sensor C having input and output impedances $Z_1$, the function of which is to sense the mismatch of the amplifier; two additional impedance elements $E_{Z1}$ and $E_{Z2}$; the impedance-matching filter $F_{adp}$; an antenna having an input impedance $Z_2$; and a processor P, the role of which is to control the variable elements. The impedance elements, in combination with the impedance-matching filter, make it possible to adjust the impedance matching in correlation with the impedance of the antenna, which impedance is likely to vary.

Figure 16:
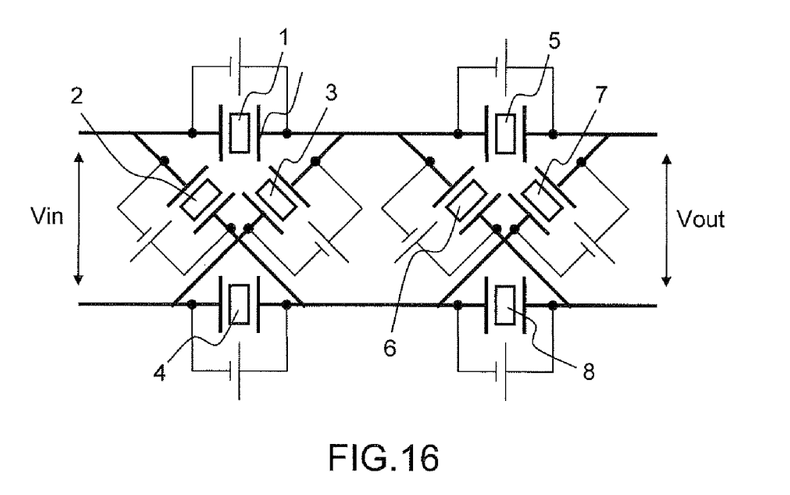
FIG. 16 illustrates an exemplary impedance-matching filter according to the invention comprising eight BAW resonators with a double lattice structure.

More precisely, the impedance-matching filter is produced using BAW resonators with a double lattice structure comprising eight resonators, referenced 1, 2, 3, 4, 5, 6, 7 and 8, electrically connected in groups of four in a trellis, as shown in FIG. 16.

Each resonator is electrically controlled by a DC voltage generator. The filter used in the present invention could equally well be a ladder network or any other network comprising an arrangement of at least two acoustic resonators, possibly including different-nature passive elements such as, for example, inductors, capacitors or transmission lines.

Figure 17:
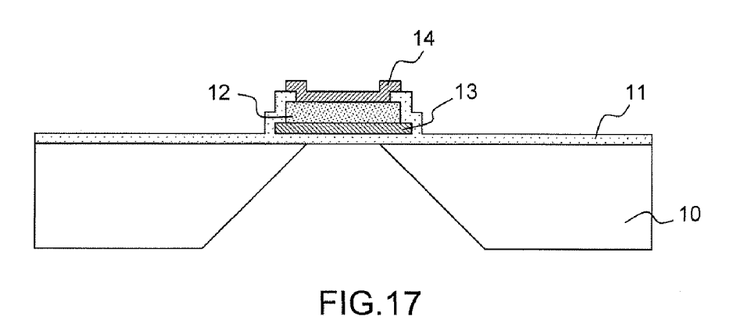
FIG. 17 illustrates a cross section through an exemplary technological multilayer forming an FBAR resonator in a matchable filter as used in the present invention.

An FBAR multilayer is one possible embodiment for each resonator. This is a technological multilayer comprising a substrate 10 containing a backside cavity, a supporting membrane 11, and a layer of electrostrictive material 12 inserted between two metal electrodes 13 and 14 as indicated in FIG. 17, which shows a cross section through such a resonator.

Figure 18:
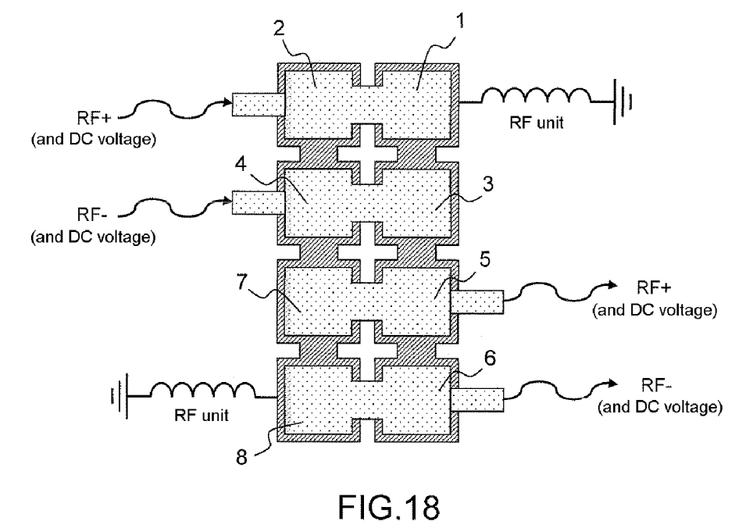
FIG. 18 illustrates a top view of an exemplary arrangement of an impedance-matching filter used in the present invention.

According to this example, the bottom electrodes are connected in groups of four and the top electrodes in groups of two, the resonators also possibly having references 1, 2, 3, 4, 5, 6, 7 and 8 in FIG. 18. It should be noted that other resonator combinations corresponding to the arrangement in FIG. 16 could also be possible.

All the bottom electrodes are DC grounded via a device ensuring RF isolation, as illustrated in FIG. 18. An identical DC voltage is here superposed on the RF signals at the input and output of the filter. According to this example, all the voltages applied may be identical for all the resonators by virtue of the proposed resonator arrangement.

The invention claimed is:

1. A device comprising:
    at the input a first component (PA) having a first output impedance ($Z_1$),
    at the output a second component (ANT) having a second input impedance ($Z_2$), and
    a variable acoustic filter between said first and second components configured to account for a variation in the first output or the second input impedance, said variable acoustic filter includes:
        a sensor directly coupled to the first output and arranged between the first component and the second component, said sensor configured to sense a mismatch between the first output and the second input impedances, and
        a filter ($F_{adp}$), with an impedance that is matchable to the first output and the second input impedances based upon the sensed mismatch between the first output and the second input impedances, said filter located between said first and second components and comprising a set of resonators connected in a ladder or a lattice structure, at least one of the resonators comprising a perovskite type material and means for applying a voltage to said resonator so as to vary the permittivity and the impedance thereof,
    wherein the means for applying a voltage are set to a voltage range in which a frequency passband of said impedance-matching filter is substantially stable, the variability of the impedance of said at least one of the resonators provides the matching of the filter impedance.

2. The device according to claim 1, in which the filter comprises bulk wave resonators.

3. The device according to claim 2, in which the filter comprises FBAR bulk wave resonators comprising a multilayer comprising at least one supporting membrane and a layer of perovskite type material.

4. The device according to claim 2, in which the filter comprises SMR bulk wave resonators comprising at least one acoustic reflector and a layer of perovskite type material.

5. The device according to claim 1, in which each resonator comprises a perovskite type material.

6. The device according to claim 1, in which the perovskite type material is based on barium strontium titanate (BST).

7. The device according to claim 1, in which said variable acoustic filter furthermore comprises additional impedance elements.

8. The device according to claim 1, in which the second component is an antenna.

9. The device according to claim 1, in which the first component is an amplifier.

10. The device according to claim 1, in which the first or the second component having a variable impedance is a transistor.

11. The device according to claim 1, including in a radio-frequency transmitter or receiver in which the first component is an amplifier (PA), the second component being an antenna (ANT).

12. The device according to claim 1, in which the means for applying a voltage are set to a voltage range in which the frequency passband of said impedance-matching filter is substantially stable.

* * * * *